(12) United States Patent
Tada et al.

(10) Patent No.: US 9,795,049 B2
(45) Date of Patent: Oct. 17, 2017

(54) SEMICONDUCTOR DEVICE

(71) Applicant: Kabushiki Kaisha Toshiba, Minato-ku, Tokyo (JP)

(72) Inventors: Nobumitsu Tada, Hachioji Tokyo (JP); Kazuya Kodani, Kawasaki Kanagawa (JP); Hiroaki Ito, Suginami Tokyo (JP); Toshiharu Ohbu, Kawasaki Kanagawa (JP); Hitoshi Matsumura, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 146 days.

(21) Appl. No.: 14/626,569

(22) Filed: Feb. 19, 2015

(65) Prior Publication Data

US 2016/0057881 A1  Feb. 25, 2016

(30) Foreign Application Priority Data

Aug. 22, 2014 (JP) .................... 2014-169664

(51) Int. Cl.
  *H05K 7/14* (2006.01)
(52) U.S. Cl.
  CPC .................. *H05K 7/1432* (2013.01)
(58) Field of Classification Search
  CPC .................. H05K 7/1432; H01L 23/3114
  USPC ........................................ 361/728
  See application file for complete search history.

(56) References Cited

U.S. PATENT DOCUMENTS

| 6,441,317 B1 * | 8/2002 | Tanaka | H01L 25/072 174/255 |
| 6,629,854 B2 * | 10/2003 | Murakami | H02B 1/20 439/212 |
| 6,636,429 B2 * | 10/2003 | Maly | H01L 23/50 257/666 |
| 6,906,404 B2 * | 6/2005 | Maly | H01L 24/49 257/678 |

(Continued)

FOREIGN PATENT DOCUMENTS

| CN | 1921105 A | 2/2007 |
| JP | H08-191130 A | 7/1996 |

(Continued)

OTHER PUBLICATIONS

Taiwanese Office Action issued on Aug. 22, 2016 in counterpart Taiwanese patent application No. 104106707, along with English translation thereof.

*Primary Examiner* — David M Sinclair
*Assistant Examiner* — Robert Brown
(74) *Attorney, Agent, or Firm* — David M. Tennant

(57) ABSTRACT

A semiconductor device includes a base plate, a semiconductor chip, and a first to a fourth terminal plates. The first terminal plate includes a first main body unit. The second terminal plate includes a second main body unit. The second main body unit opposes the first main body unit. The third terminal plate includes a third main body unit. The third main body unit opposes the first main body unit and the second main body unit. The fourth terminal plate includes a fourth main body unit. The fourth main body unit opposes the third main body unit. A thickness of the third main body unit is thinner than a thickness of the first main body unit. A thickness of the fourth main body unit is thinner than a thickness of the second main body unit.

20 Claims, 10 Drawing Sheets

(56) References Cited

U.S. PATENT DOCUMENTS

| | | | | |
|---|---|---|---|---|
| 7,542,317 B2* | 6/2009 | Azuma | H01L 24/40 | 257/177 |
| 8,076,696 B2* | 12/2011 | Beaupre | H01L 24/49 | 257/177 |
| 8,405,206 B1* | 3/2013 | Duetemeyer | H01L 25/072 | 257/693 |
| 8,482,904 B2* | 7/2013 | Darroman | H02M 7/003 | 361/624 |
| 8,736,043 B2* | 5/2014 | Konno | H01L 29/417 | 257/693 |
| 9,130,095 B2* | 9/2015 | Kim | H01L 31/0504 | |
| 2002/0034087 A1* | 3/2002 | Suzuki | H02M 7/003 | 363/144 |
| 2004/0227231 A1* | 11/2004 | Maly | H01L 24/49 | 257/724 |
| 2007/0177358 A1* | 8/2007 | Schilling | H01L 25/072 | 361/730 |
| 2007/0246812 A1* | 10/2007 | Zhuang | H01L 25/115 | 257/678 |
| 2008/0105896 A1* | 5/2008 | Kawaguchi | H01L 23/5385 | 257/177 |
| 2010/0089641 A1* | 4/2010 | Esmaili | H05K 7/1432 | 174/70 B |
| 2010/0232131 A1* | 9/2010 | Qian | H01L 23/49524 | 361/813 |
| 2010/0327654 A1 | 12/2010 | Azuma et al. | | |
| 2011/0101515 A1* | 5/2011 | Beaupre | H01L 24/49 | 257/691 |
| 2012/0058681 A1* | 3/2012 | Suzuki | H01L 23/49861 | 439/656 |
| 2013/0021759 A1* | 1/2013 | Zschieschang | H01L 23/3735 | 361/728 |
| 2013/0039103 A1* | 2/2013 | Smolenski | H02M 7/003 | 363/123 |
| 2014/0008781 A1* | 1/2014 | Nishi | H01L 23/52 | 257/691 |
| 2014/0023893 A1* | 1/2014 | Shimizu | H01M 2/1077 | 429/72 |
| 2014/0035120 A1* | 2/2014 | Nishi | H01L 23/42 | 257/691 |
| 2015/0287665 A1* | 10/2015 | Hanada | H01L 23/538 | 257/691 |
| 2016/0094150 A1* | 3/2016 | Domurat-Linde | H02P 27/00 | 318/503 |

FOREIGN PATENT DOCUMENTS

| | | | |
|---|---|---|---|
| JP | H10-125856 A | | 5/1998 |
| JP | 2001-135788 A | | 5/2001 |
| JP | 2005-347561 A | | 12/2005 |
| JP | 2006216756 A | * | 8/2006 |
| JP | 2008099397 A | * | 4/2008 |
| JP | 2011-015460 A | | 1/2011 |
| JP | 2013-140889 A | | 7/2013 |
| JP | 2014-050206 A | | 3/2014 |

* cited by examiner

SEMICONDUCTOR DEVICE

CROSS-REFERENCE TO RELATED APPLICATIONS

This application is based upon and claims the benefit of priority from Japanese Patent Application No. 2014-169664, filed on Aug. 22, 2014; the entire contents of which are incorporated herein by reference.

FIELD

Embodiments described herein relate generally to a semiconductor device.

BACKGROUND

There is a semiconductor device that includes a semiconductor chip and a pair of electrode plates contained in a package interior. A switching element is provided in the semiconductor chip. The semiconductor chip is electrically connected to the pair of electrode plates. Portions of the pair of electrode plates are exposed outside the package and function as electrode terminals. Electrical power is supplied to the semiconductor chip via the pair of electrode plates. Such a semiconductor device is used in, for example, an inverter circuit of a power converter, etc. In the semiconductor device, the inductance that parasitically occurs in the internal interconnects affects the surge voltage generated when switching. The surge voltage causes failure and/or a shorter life of the semiconductor chip. Therefore, in the semiconductor device, it is desirable to suppress the inductance parasitically occurring in the internal interconnects.

DETAILED DESCRIPTION

Figure 1:
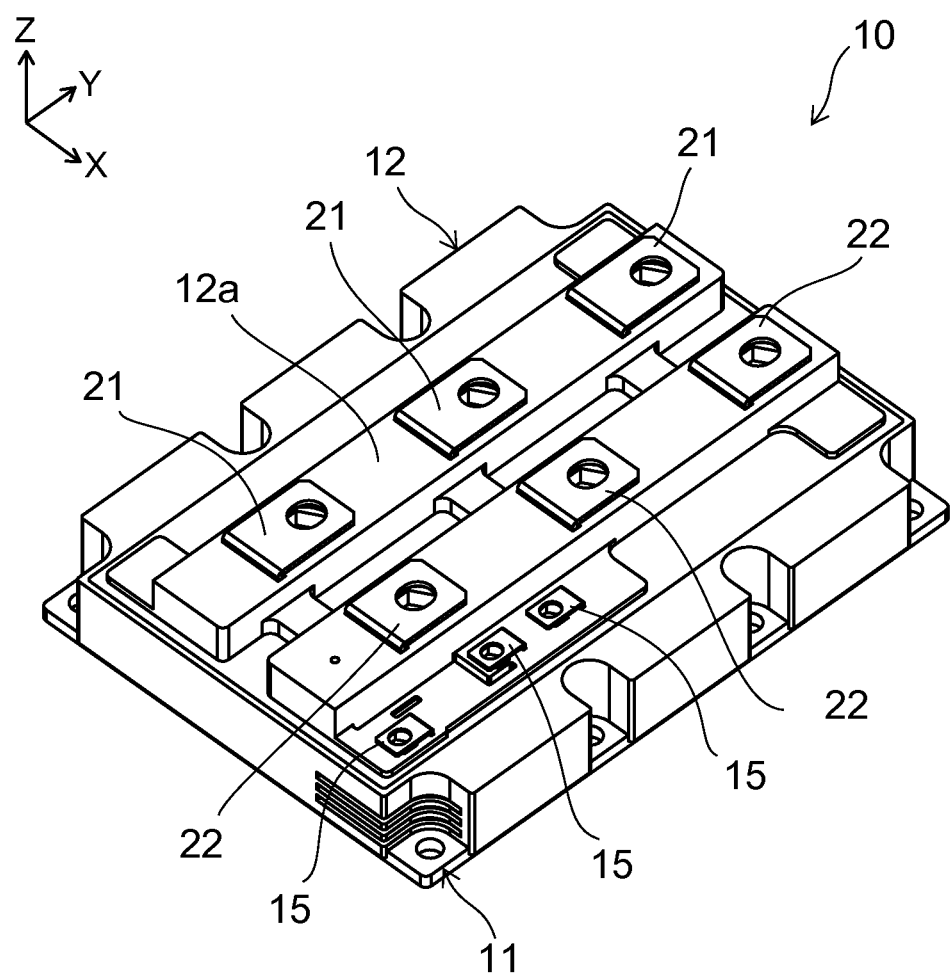
FIG. 1 is a perspective view schematically showing a semiconductor device according to a first embodiment.

According to one embodiment, a semiconductor device includes a base plate, a semiconductor chip, a first terminal plate, a second terminal plate, a third terminal plate, and a fourth terminal plate. The base plate has a support surface. The semiconductor chip is provided on the support surface. The semiconductor chip includes a switching element. The switching element includes a first electrode and a second electrode. The first terminal plate includes a first main body unit. The first terminal plate is electrically connected to the first electrode. The second terminal plate includes a second main body unit. The second main body unit opposes the first main body unit at a prescribed spacing from the first main body unit. The second terminal plate is electrically connected to the second electrode. The third terminal plate includes a third main body unit. The third main body unit opposes the first main body unit and the second main body unit at prescribed spacings from the first main body unit and the second main body unit. The third terminal plate is electrically connected to the first electrode and the first terminal plate. The fourth terminal plate includes a fourth main body unit. The fourth main body unit opposes the third main body unit at a prescribed spacing from the third main body unit. The fourth terminal plate is electrically connected to the second electrode and the second terminal plate. A thickness of the third main body unit is thinner than a thickness of the first main body unit. A thickness of the fourth main body unit is thinner than a thickness of the second main body unit.

According to another embodiment, a semiconductor device includes a base plate, a semiconductor chip, a first terminal plate, a second terminal plate, a third terminal plate, and a fourth terminal plate. The base plate has a support surface. The semiconductor chip is provided on the support surface. The semiconductor chip includes a switching element. The switching element includes a first electrode and a second electrode. The first terminal plate includes a first main body unit. The first terminal plate is electrically connected to the first electrode. The second terminal plate includes a second main body unit. The second main body unit opposes the first main body unit at a prescribed spacing from the first main body unit. The second terminal plate is electrically connected to the second electrode. The third terminal plate is provided to overlap the second main body unit with an insulating member interposed. The third terminal plate is electrically connected to the first electrode and the first terminal plate. The fourth terminal plate is provided to overlap the first main body unit with an insulating member interposed. The fourth terminal plate is electrically connected to the second electrode and the second terminal plate. A thickness of the third terminal plate is thinner than a thickness of the first main body unit. A thickness of the fourth terminal plate is thinner than a thickness of the second main body unit.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Also, the dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

First Embodiment

FIG. 1 is a perspective view schematically showing a semiconductor device according to a first embodiment.

Figure 2:
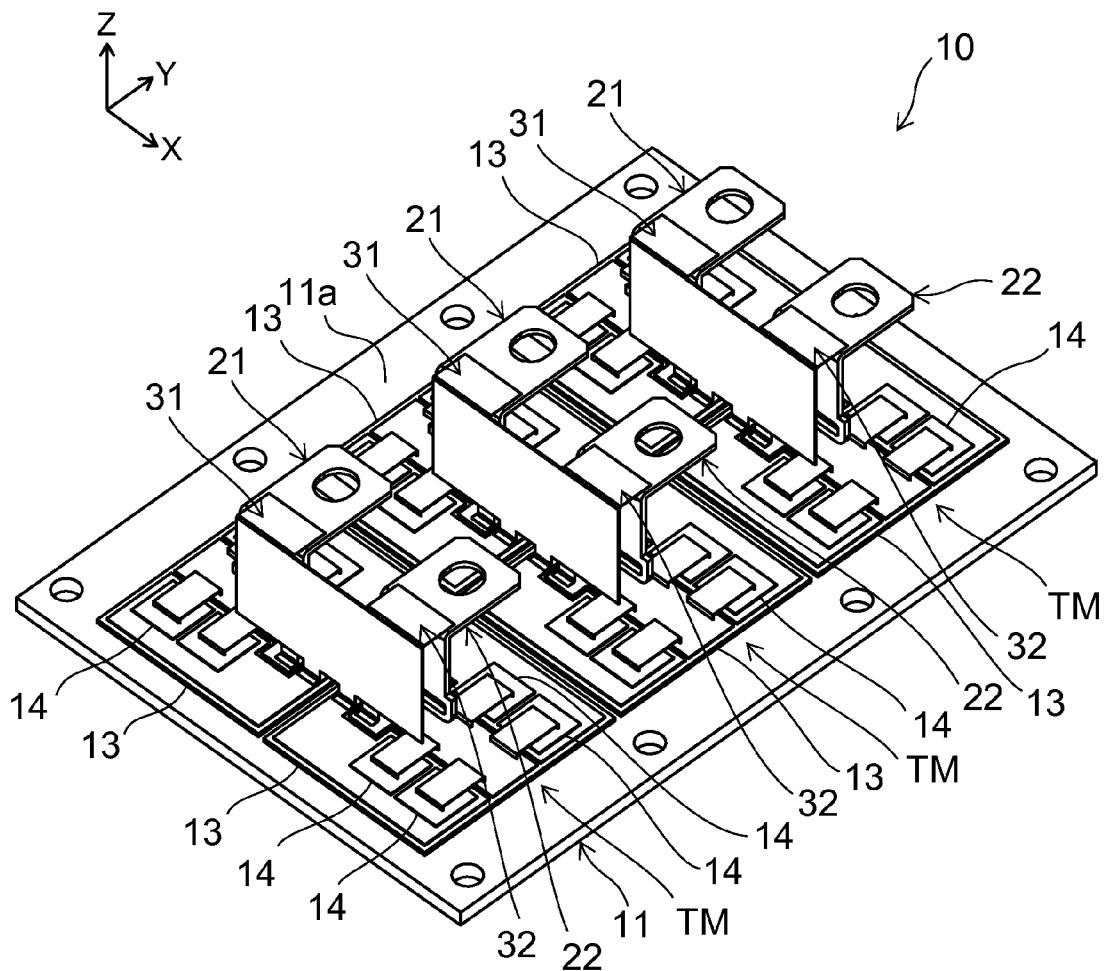
FIG. 2 is a perspective view schematically showing a portion of the semiconductor device according to the first embodiment.

FIG. 2 is a perspective view schematically showing a portion of the semiconductor device according to the first embodiment.

As shown in FIG. 1 and FIG. 2, the semiconductor device 10 includes a base plate 11, a case 12, a substrate 13, a semiconductor chip 14, a control terminal 15, a first positive terminal plate 21 (a first terminal plate), a first negative terminal plate 22 (a second terminal plate), a second positive terminal plate 31 (a third terminal plate), and a second negative terminal plate 32 (a fourth terminal plate).

The case 12 is provided on the base plate 11 and covers the substrate 13, the semiconductor chip 14, etc. For example, the case 12 protects the substrate 13, the semiconductor chip 14, etc. FIG. 2 shows the state in which the case 12 is removed from the base plate 11.

The semiconductor chip 14 includes a switching element. The switching element includes, for example, a first electrode, a second electrode, and a control electrode. The switching element that is provided in the semiconductor chip 14 is, for example, an IGBT (Insulated Gate Bipolar Transistor), a power MOSFET (Metal-Oxide-Semiconductor Field-Effect Transistor), etc. The number of switching elements provided in the semiconductor chip 14 may be one or multiple.

The control terminal 15 and the terminal plates 21, 22, 31, and 32 are electrically conductive. The control terminal 15 and the terminal plates 21, 22, 31, and 32 are electrically connected to the semiconductor chip 14. For example, in the case where an n-channel IGBT is provided in the semiconductor chip 14, the first positive terminal plate 21 and the second positive terminal plate 31 are electrically connected to the collector electrode of the IGBT. The first negative terminal plate 22 and the second negative terminal plate 32 are electrically connected to the emitter electrode of the IGBT. The control terminal 15 is electrically connected to the gate electrode of the IGBT. In other words, in the case where the switching element that is provided in the semiconductor chip is an n-channel IGBT, the first electrode is the collector electrode; the second electrode is the emitter electrode; and the control electrode is the gate electrode.

In the semiconductor device 10, a voltage is applied between the first positive terminal plate 21 and the first negative terminal plate 22 (e.g., between the emitter-collector). For example, the first negative terminal plate 22 and the second negative terminal plate 32 are set to a common potential. The first positive terminal plate 21 and the second positive terminal plate 31 are set to a potential that is higher than that of the first negative terminal plate 22 and the second negative terminal plate 32.

A control signal is input to the control terminal 15. The switching element is switched ON/OFF according to the control signal input to the control terminal 15. Thereby, in the semiconductor device 10, the state is switched between an ON state in which a current flows between the first positive terminal plate 21 and the first negative terminal plate 22 and an OFF state in which a current that is lower than that of the ON state flows between the first positive terminal plate 21 and the first negative terminal plate 22. The OFF state is a state in which a current substantially does not flow between the first positive terminal plate 21 and the first negative terminal plate 22.

Multiple semiconductor chips 14 are provided in the semiconductor device 10. The semiconductor device 10 connects the multiple switching elements provided in the multiple semiconductor chips 14 in parallel. Thereby, the semiconductor device 10 functions as, for example, one switching element having a large capacity. The semiconductor device 10 is a so-called power semiconductor module. For example, the semiconductor device 10 is used in the inverter circuit of a railway car, etc.

The base plate 11 has a substantially rectangular plate configuration. The base plate 11 has a support surface 11a supporting the substrate 13, etc. The support surface 11a has a rectangular configuration. The base plate 11 includes a material having a high thermal conductivity. The base plate 11 includes, for example, a metal material.

Here, a direction perpendicular to the support surface 11a is taken as a Z-axis direction. One direction perpendicular to the Z-axis direction is taken as an X-axis direction. A direction perpendicular to the Z-axis direction and the X-axis direction is taken as a Y-axis direction. The X-axis direction and the Y-axis direction are directions parallel to the support surface 11a. A pair of sides of the support surface 11a extends in the X-axis direction. Another pair of sides of the support surface 11a extends in the Y-axis direction.

The case 12 has a substantially rectangular parallelepiped box configuration. The case 12 has an open box configuration in which the support surface 11a side is open; and the case 12 covers the substrate 13 and the semiconductor chip 14 in the state of being mounted on the support surface 11a. The configurations of the base plate 11 and the case 12 are not limited to those recited above and may be any configuration. The case 12 is insulative. The case 12 includes, for example, a resin material, a ceramic, etc.

The case 12 has an upper surface 12a. The upper surface 12a faces substantially the same direction as the support surface 11a. For example, the upper surface 12a is substantially parallel to the support surface 11a. The control terminal 15 is provided on the upper surface 12a. In the example, the three control terminals 15 are provided on the upper surface 12a. The number of control terminals 15 is arbitrary and is not limited to three.

Multiple substrates 13 are provided in the semiconductor device 10. The multiple substrates 13 are provided to be arranged on the support surface 11a of the base plate 11. In the example, a total of six substrates 13 are provided to be arranged two in the X-axis direction and three in the Y-axis direction. The number of substrates 13 is arbitrary and is not limited to six.

The multiple semiconductor chips 14 are provided on each of the multiple substrates 13. The semiconductor chips 14 are multiply provided on one substrate 13. In the example, four semiconductor chips 14 are provided on each of the six substrates 13. In other words, in the example, a total of 24 semiconductor chips 14 are provided. The number of semiconductor chips 14 provided on one substrate 13 is arbitrary and is not limited to four. The number of semiconductor chips 14 provided on one substrate 13 may be one. The substrate 13 and the semiconductor chip 14 are not limited to being multiply provided and may be one each. Also, the substrate 13 may be omitted. For example, an interconnect pattern may be formed on an insulative base plate 11; and the semiconductor chip 14 may be disposed on the interconnect of the base plate 11.

Three of each of the terminal plates 21, 22, 31, and 32 are provided. Each of the terminal plates 21, 22, 31, and 32 is used commonly by two substrates 13 arranged in the X-axis direction. In other words, in the example, one unit is formed of two substrates 13, eight semiconductor chips 14, and one of each of the terminal plates 21, 22, 31, and 32; and three sets of units are disposed to be arranged in the Y-axis direction. The number of units included in the semiconductor device 10 is not limited to three sets and may be one set, two sets, four sets, or more. Hereinbelow, the one unit recited above is called a ⅓ model TM. Each of the ⅓ models TM is connected in parallel outside the case 12 by, for example, a bus bar, etc. Thereby, the semiconductor device 10 functions as one switching element. Each of the ⅓ models TM may be connected in parallel inside the case 12.

Figure 3:
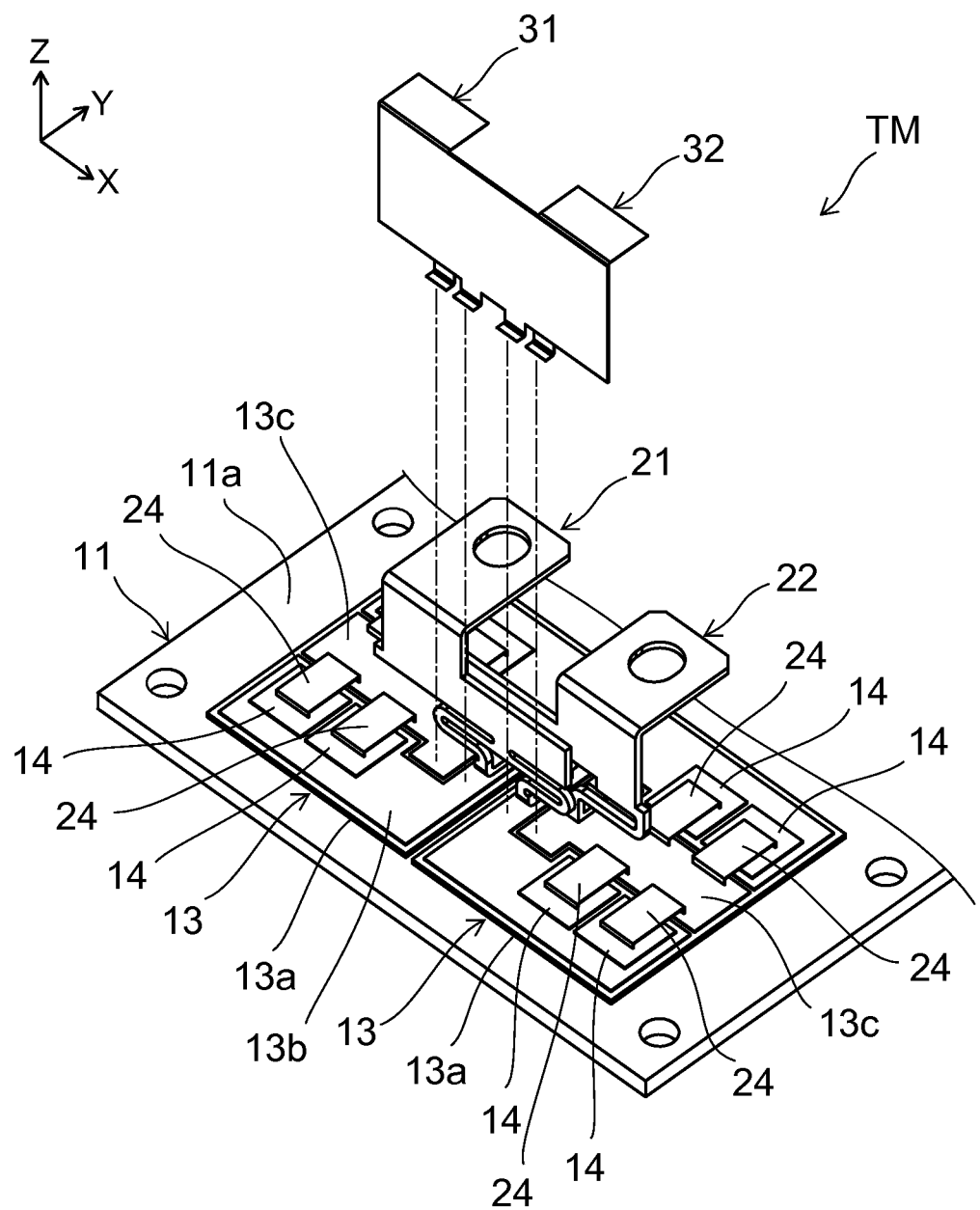
FIG. 3 is an exploded perspective view schematically showing a portion of the semiconductor device according to the first embodiment.

FIG. 3 is an exploded perspective view schematically showing a portion of the semiconductor device according to the first embodiment.

FIG. 3 schematically shows the ⅓ model TM.

As shown in FIG. 3, the substrate 13 includes a substrate main body 13a, a first interconnect pattern 13b, and a second interconnect pattern 13c. The substrate main body 13a has a substantially rectangular plate configuration. The substrate main body 13a is insulative. Also, the substrate main body 13a has high thermal conductivity. The substrate main body 13a includes, for example, a ceramic.

The first interconnect pattern 13b is provided on the substrate main body 13a. The second interconnect pattern 13c is provided on the substrate main body 13a and disposed to be separated from the first interconnect pattern 13b. For example, the second interconnect pattern 13c is electrically insulated from the first interconnect pattern 13b. The interconnect patterns 13b and 13c are electrically conductive. The electrical conductivities of the interconnect patterns 13b and 13c are higher than the electrical conductivity of the substrate main body 13a. The interconnect patterns 13b and 13c include, for example, copper foils. For example, the substrate 13 may further include another interconnect pattern on the back surface of the substrate main body 13a (the surface opposite to the surface where the interconnect patterns 13b and 13c are provided).

Each of the semiconductor chips 14 is provided on the first interconnect pattern 13b. An electrode is provided on the back surface of each of the semiconductor chips 14 (the surface facing the first interconnect pattern 13b). Each of the semiconductor chips 14 is electrically connected to the first interconnect pattern 13b via an electrode provided on the back surface. Thereby, for example, the collector electrode of the switching element provided in the semiconductor chip 14 is electrically connected to the first interconnect pattern 13b.

An electrode is provided also on the front surface of each of the semiconductor chips 14. One end of a bonding wire 24 is connected to the electrode on the front surface of each of the semiconductor chips 14. The other end of the bonding wire 24 is connected to the second interconnect pattern 13c. Thereby, each of the semiconductor chips 14 is electrically connected to the second interconnect pattern 13c via the electrode on the front surface and the bonding wire 24. For example, the emitter electrode of the switching element provided in the semiconductor chip 14 is electrically connected to the second interconnect pattern 13c.

The bonding wire 24 includes, for example, pure aluminum. Single bonding wires 24 that have fine circular cross sections are multiply provided three-dimensionally in parallel. Here, the multiple bonding wires 24 are shown as having a tape configuration for convenience.

For example, other than the electrode connected to the bonding wire 24, a control electrode is provided on the front surface of each of the semiconductor chips 14. The control electrode is electrically connected to the control terminal 15 via a not-shown interconnect, etc. Thereby, for example, the gate electrode of the switching element provided in the semiconductor chip 14 is electrically connected to the control terminal 15. The control electrode may be electrically connected to each of the control terminals 15 or may be electrically connected to one of the control terminals 15. In other words, the ON/OFF of the multiple switching elements provided in the semiconductor device 10 may be controlled together by one control signal or may be controlled individually by multiple control signals.

FIG. 4A to FIG. 4D are perspective views schematically showing a portion of the semiconductor device according to the first embodiment.

Figure 4A:
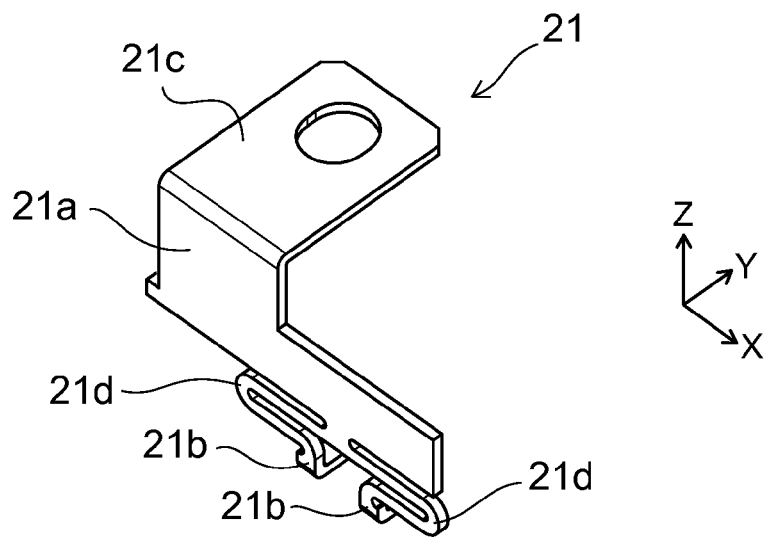
FIG. 4A to FIG. 4D are perspective views schematically showing a portion of the semiconductor device according to the first embodiment.

FIG. 4A schematically shows the first positive terminal plate 21.

Figure 4B:
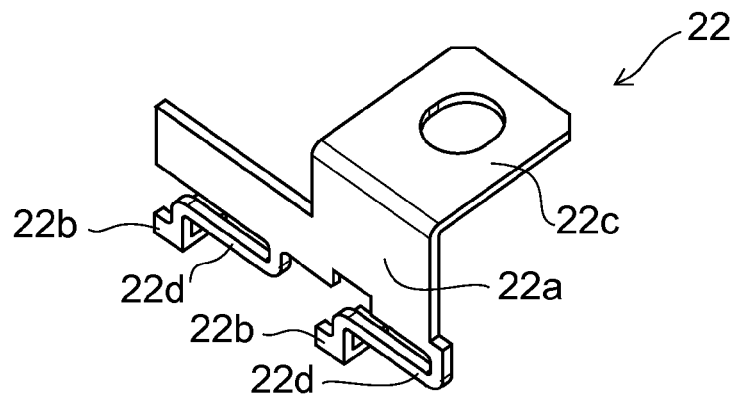

FIG. 4B schematically shows the first negative terminal plate 22.

Figure 4C:
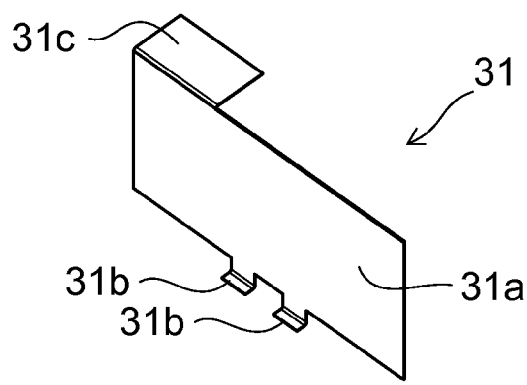

FIG. 4C schematically shows the second positive terminal plate 31.

Figure 4D:
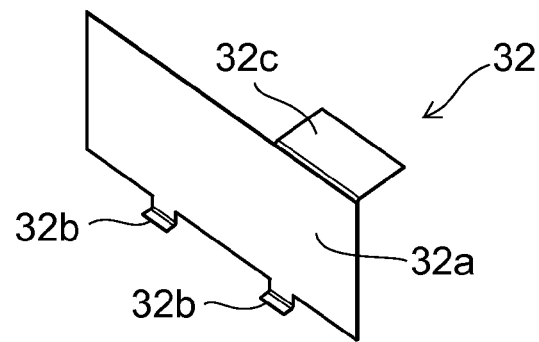

FIG. 4D schematically shows the second negative terminal plate 32.

As shown in FIG. 4A, the first positive terminal plate 21 includes a main body unit 21a (a first main body unit) that extends in the X-axis direction (a first direction) and extends in the Z-axis direction (a second direction). The main body unit 21a has, for example, a plate configuration parallel to the X-Z plane. Here, "extending in the X-axis direction" is not limited to the case of being aligned with the X-axis direction; and it is sufficient to have at least a component extending in the X-axis direction. This is similar for the other directions as well.

Multiple connectors 21b (first connectors) are provided at one Z-axis direction end of the main body unit 21a. In the example, two connectors 21b are provided. Namely, each of the connectors 21b is provided at the lower end of the main body unit 21a. The connectors 21b are electrically connected respectively to the first interconnect patterns 13b of two substrates 13 arranged in the X-axis direction. In other words, the connector 21b is electrically connected to the first electrode of the switching element provided in the semiconductor chip 14 via the first interconnect pattern 13b. Thereby, the first interconnect patterns 13b of the substrates 13 are electrically connected to each other via the first positive terminal plate 21. For example, the collector electrodes of the switching elements provided in the semiconductor chips 14 are connected in parallel.

In the example, two substrates 13 are provided to be arranged in the X-axis direction in one ⅓ model TM. The number of substrates 13 arranged in the X-axis direction in the ⅓ model TM is not limited to two and may be three or more. It is sufficient for a number of multiple connectors 21b to be provided according to the number of substrates 13 arranged in the X-axis direction. In the case where the number of substrates 13 is one and the number of semiconductor chips 14 is one, the number of connectors 21b also is one. The direction in which the multiple substrates 13 are arranged is not limited to the X-axis direction and may be any direction parallel to the support surface 11a.

A terminal unit 21c (a first terminal unit) is provided at the other Z-axis direction end of the main body unit 21a. Namely, the terminal unit 21c is provided at the upper end of the main body unit 21a. The terminal unit 21c protrudes outside the case 12 via an opening provided in the case 12. The terminal unit 21c is bent substantially 90° and is aligned with the upper surface 12a of the case 12. The terminal unit 21c is used as an electrical connection to an external device. Thereby, for example, the external device is electrically connected to the collector electrode of the switching element provided in the semiconductor chip 14. In other words, the terminal unit 21c functions as a positive terminal.

The first positive terminal plate 21 includes multiple bend portions 21d provided between the main body unit 21a and each of the multiple connectors 21b. Each of the bend portions 21*d* is bent around an axis in the Y-axis direction and is aligned with a surface (the X-Z plane) parallel to the main body unit 21*a*. For example, each of the bend portions 21*d* reduces the stress applied to each of the connectors 21*b* due to the elastic deformation due to the temperature change during use. For example, each of the bend portions 21*d* improves the bonding reliability of each of the connectors 21*b*. In the example, each of the bend portions 21*d* has a bend configuration bent into a U-shaped configuration. The configuration of each of the bend portions 21*d* is not limited thereto and may be any configuration.

As shown in FIG. 4B, the first negative terminal plate 22 includes a main body unit 22*a* (a second main body unit) extending in the X-axis direction and extending in the Z-axis direction. For example, the main body unit 22*a* has a plate configuration parallel to the X-Z plane. The main body unit 22*a* opposes the main body unit 21*a* of the first positive terminal plate 21 at a prescribed spacing from the main body unit 21*a*. The main body unit 22*a* is disposed substantially parallel to the main body unit 21*a*.

Multiple connectors 22*b* (second connectors) are provided at one Z-axis direction end of the main body unit 22*a*. In the example, two connectors 22*b* are provided. Namely, each of the connectors 22*b* is provided at the lower end of the main body unit 22*a*. The connectors 22*b* are electrically connected respectively to the second interconnect patterns 13*c* of two substrates 13 arranged in the X-axis direction. The connector 22*b* is electrically connected to the second electrode of the switching element provided in the semiconductor chip 14 via the second interconnect pattern 13*c*. Thereby, the second interconnect patterns 13*c* of the substrates 13 are electrically connected to each other via the first negative terminal plate 22. For example, the emitter electrodes of the switching elements provided in the semiconductor chips 14 are connected in parallel.

A terminal unit 22*c* (a second terminal unit) is provided at the other Z-axis direction end of the main body unit 22*a*. Namely, the terminal unit 22*c* is provided at the upper end of the main body unit 22*a*. Similarly to the terminal unit 21*c* of the first positive terminal plate 21, the terminal unit 22*c* protrudes outside the case 12 and functions as a negative terminal.

The first negative terminal plate 22 includes multiple bend portions 22*d* provided between the main body unit 22*a* and each of the multiple connectors 22*b*. Each of the bend portions 22*d* is bent around an axis in the Y-axis direction and is aligned with the surface parallel to the main body unit 22*a*. Similarly to each of the bend portions 21*d* of the first positive terminal plate 21, for example, each of the bend portions 22*d* improves the bonding reliability of each of the connectors 22*b*. The configuration of each of the bend portions 22*d* may be any configuration.

As shown in FIG. 4C, the second positive terminal plate 31 includes a main body unit 31*a* (a third main body unit) that extends in the X-axis direction and extends in the Z-axis direction. The main body unit 31*a* has, for example, a plate configuration parallel to the X-Z plane. The main body unit 31*a* opposes the main body unit 21*a* of the first positive terminal plate 21 and the main body unit 22*a* of the first negative terminal plate 22 at prescribed spacings from the main body unit 21*a* and the main body unit 22*a*. The main body unit 31*a* is disposed to be substantially parallel to the main body unit 21*a* and the main body unit 22*a*.

Multiple connectors 31*b* (third connectors) are provided at one Z-axis direction end of the main body unit 31*a*. In the example, two connectors 31*b* are provided. Namely, each of the connectors 31*b* is provided at the lower end of the main body unit 31*a*. The connectors 31*b* are electrically connected respectively to the first interconnect patterns 13*b* of two substrates 13 arranged in the X-axis direction. The connector 31*b* is electrically connected to the first electrode of the switching element provided in the semiconductor chip 14 via the first interconnect pattern 13*b*. The electrical connection between the first electrode and the connectors 21*b* and 31*b* is not limited to the first interconnect pattern 13*b* and may be performed via another interconnect member.

An interconnect unit 31*c* is provided at the other Z-axis direction end of the main body unit 31*a*. Namely, the interconnect unit 31*c* is provided at the upper end of the main body unit 31*a*. The interconnect unit 31*c* is electrically connected to the first positive terminal plate 21. For example, the interconnect unit 31*c* contacts the first positive terminal plate 21. The interconnect unit 31*c* is connected to the upper end vicinity of the main body unit 21*a* of the first positive terminal plate 21. For example, the interconnect unit 31*c* is connected to the terminal unit 21*c*. The second positive terminal plate 31 is electrically connected to the first electrode of the switching element and the first positive terminal plate 21. In other words, the second positive terminal plate 31 is connected to the first positive terminal plate 21 in parallel. Thereby, for example, the two current paths of the current path flowing through the first positive terminal plate 21 and the current path flowing through the second positive terminal plate 31 are provided between the external device and the semiconductor chip.

As shown in FIG. 4D, the second negative terminal plate 32 includes a main body unit 32*a* (a fourth main body unit) that extends in the X-axis direction and extends in the Z-axis direction. The main body unit 32*a* has, for example, a plate configuration parallel to the X-Z plane. The main body unit 32*a* opposes the main body unit 31*a* of the second positive terminal plate 31 at a prescribed spacing from the main body unit 31*a*. The main body unit 32*a* is disposed to be substantially parallel to the main body unit 31*a*.

Multiple connectors 32*b* (fourth connectors) are provided at one Z-axis direction end of the main body unit 32*a*. In the example, two connectors 32*b* are provided. Namely, each of the connectors 32*b* is provided at the lower end of the main body unit 32*a*. The connectors 32*b* are electrically connected respectively to the second interconnect patterns 13*c* of two substrates 13 arranged in the X-axis direction. The connector 32*b* is electrically connected to the second electrode of the switching element provided in the semiconductor chip 14 via the second interconnect pattern 13*c*. The electrical connection between the second electrode and the connectors 22*b* and 32*b* is not limited to the second interconnect pattern 13*c* and may be performed via another interconnect member.

An interconnect unit 32*c* is provided at the other Z-axis direction end of the main body unit 32*a*. Namely, the interconnect unit 32*c* is provided at the upper end of the main body unit 32*a*. The interconnect unit 32*c* is electrically connected to the first negative terminal plate 22. For example, the interconnect unit 32*c* contacts the first negative terminal plate 22. The interconnect unit 32*c* is connected to the upper end vicinity of the main body unit 22*a* of the first negative terminal plate 22. For example, the interconnect unit 32*c* is connected to the terminal unit 22*c*. The second negative terminal plate 32 is electrically connected to the second electrode of the switching element and the first negative terminal plate 22. In other words, the second negative terminal plate 32 is connected to the first negative terminal plate 22 in parallel. Thereby, for example, the two current paths of the current path flowing through the first negative terminal plate 22 and the current path flowing through the second negative terminal plate 32 are provided between the external device and the semiconductor chip.

Figure 5A:
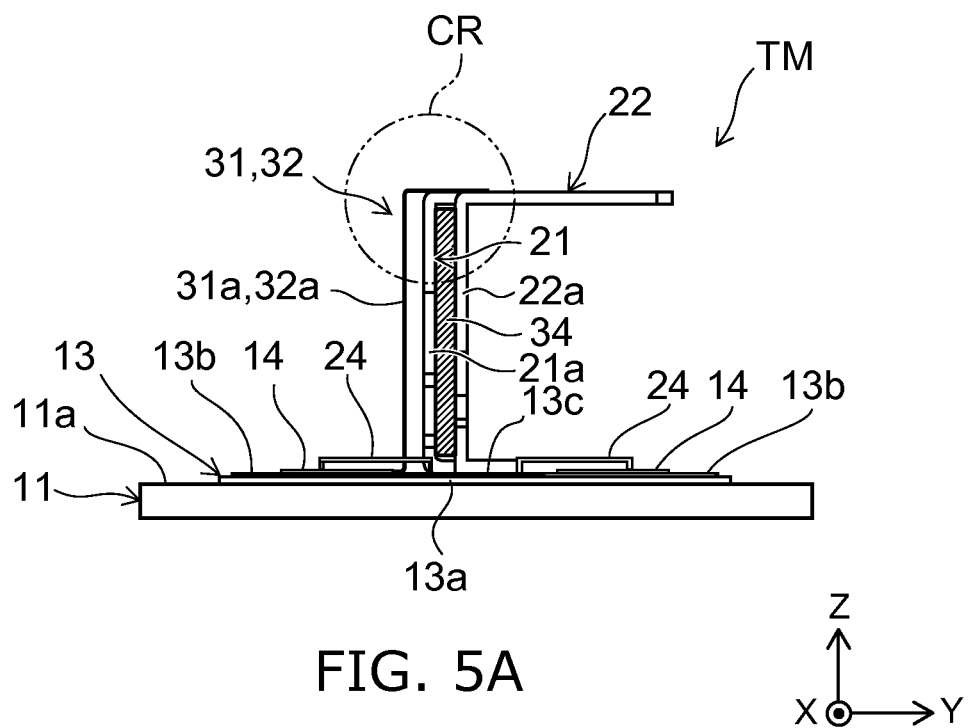
FIG. 5A and FIG. 5B are side views schematically showing a portion of the semiconductor device according to the first embodiment.
Figure 5B:
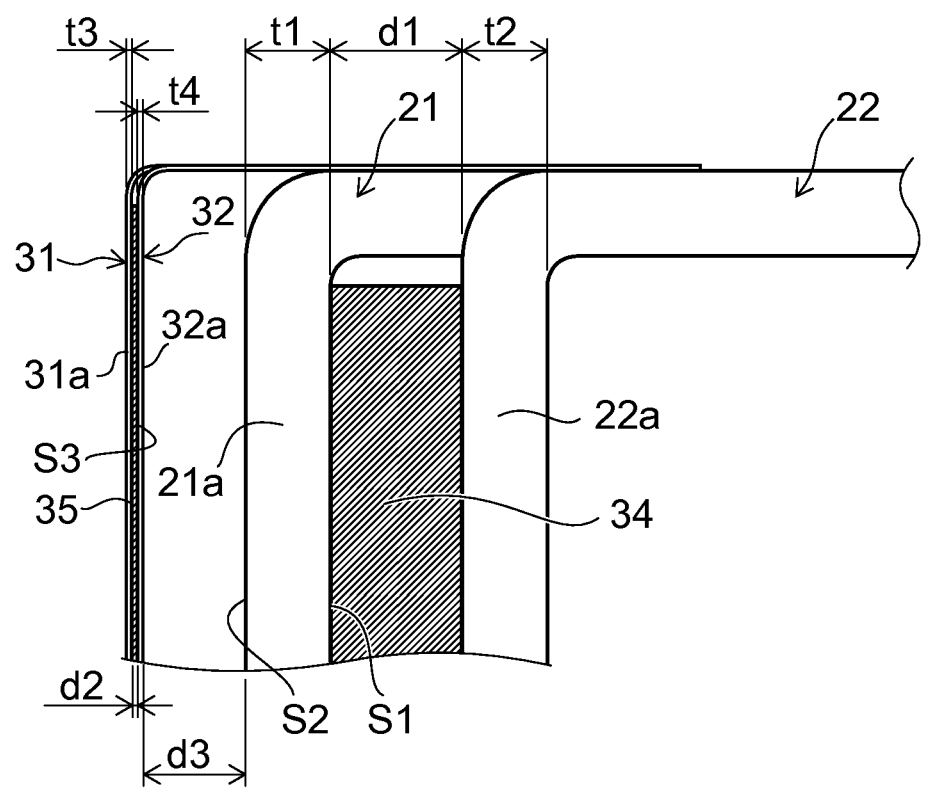

FIG. 5A and FIG. 5B are side views schematically showing a portion of the semiconductor device according to the first embodiment.

FIG. 5A is a side view of the ⅓ model TM as viewed from the X-axis direction.

FIG. 5B is a partially enlarged view of the enlarged interior of the imaginary circle CR of FIG. 5A.

The imaginary circle CR is illustrated for convenience but is not an actual object in the ⅓ model TM.

As shown in FIG. 5A and FIG. 5B, the main body unit 22a of the first negative terminal plate 22 opposes one surface S1 of the main body unit 21a of the first positive terminal plate 21 facing the Y-axis direction. The main body unit 31a of the second positive terminal plate 31 opposes the other surface S2 of the main body unit 21a of the first positive terminal plate 21 facing the Y-axis direction. The surface S2 is the surface on the side opposite to the surface S1. In other words, the main body unit 21a of the first positive terminal plate 21 is provided between the main body unit 22a of the first negative terminal plate 22 and the main body unit 31a of the second positive terminal plate 31.

The main body unit 31a of the second positive terminal plate 31 has a surface S3 opposing the surface S2. The main body unit 32a of the second negative terminal plate 32 opposes the surface S3. In other words, the main body unit 32a of the second negative terminal plate 32 is provided between the main body unit 21a of the first positive terminal plate 21 and the main body unit 31a of the second positive terminal plate 31. Thus, the main body units 21a, 22a, 31a, and 32a are arranged in the Y-axis direction. The order in which the main body units 21a, 22a, 31a, and 32a are arranged is not limited to that recited above.

An insulating member 34 (a second insulating member) is provided between the main body unit 21a of the first positive terminal plate 21 and the main body unit 22a of the first negative terminal plate 22. An insulating member 35 (a first insulating member) is provided between the main body unit 31a of the second positive terminal plate 31 and the main body unit 32a of the second negative terminal plate 32. For easier viewing in FIG. 5A and FIG. 5B, the insulating members 34 and 35 are marked by hatching for convenience. The insulating member 34 suppresses contact between the main body unit 21a and the main body unit 22a. Similarly, the insulating member 35 suppresses contact between the main body unit 31a and the main body unit 32a. In other words, the insulating members 34 and 35 suppress shorts between the positive electrodes and the negative electrodes. The insulating members 34 and 35 include, for example, resin materials. The materials of the insulating members 34 and 35 may be any material that is electrically insulative and capable of suppressing the shorts between the positive electrodes and the negative electrodes.

Thus, the main body unit 21a of the first positive terminal plate 21 is insulatively stacked with the main body unit 22a of the first negative terminal plate 22 with the insulating member 34 interposed. The main body unit 31a of the second positive terminal plate 31 is insulatively stacked with the main body unit 32a of the second negative terminal plate 32 with the insulating member 35 interposed.

A thickness t1 (the length in the Y-axis direction) of the main body unit 21a of the first positive terminal plate 21 is, for example, 1.5 mm (not less than 0.5 mm and not more than 3 mm). A thickness t2 of the main body unit 22a of the first negative terminal plate 22 is, for example, 1.5 mm (not less than 0.5 mm and not more than 3 mm). A spacing d1 between the main body unit 21a and the main body unit 22a is, for example, 2.3 mm (not less than 0.5 mm and not more than 4 mm).

A thickness t3 of the main body unit 31a of the second positive terminal plate 31 is, for example, 0.1 mm (not less than 0.005 mm and not more than 0.3 mm). A thickness t4 of the main body unit 32a of the second negative terminal plate 32 is, for example, 0.1 mm (not less than 0.005 mm and not more than 0.3 mm). A spacing d2 between the main body unit 31a and the main body unit 32a is, for example, 0.1 mm (not less than 0.005 mm and not more than 0.3 mm). Also, in the example, a spacing d3 between the main body unit 21a of the first positive terminal plate 21 and the main body unit 32a of the second negative terminal plate 32 is, for example, 2 mm (not less than 0.5 mm and not more than 4 mm). For example, the spacing d3 is set to be about the same as the spacing d1.

Thus, the thickness t3 of the main body unit 31a of the second positive terminal plate 31 is thinner than the thickness t1 of the main body unit 21a of the first positive terminal plate 21. The thickness t4 of the main body unit 32a of the second negative terminal plate 32 is thinner than the thickness t2 of the main body unit 22a of the first negative terminal plate 22. The spacing d2 between the main body unit 31a and the main body unit 32a is narrower than the spacing d1 between the main body unit 21a and the main body unit 22a. In other words, the distance between the main body unit 31a and the main body unit 32a is shorter than the distance between the main body unit 21a and the main body unit 22a. The opposing surface area between the main body unit 31a and the main body unit 32a is greater than the opposing surface area between the main body unit 21a and the main body unit 22a.

The thickness t3 is, for example, not less than 0.01 times and not more than 0.1 times the thickness t1. The thickness t4 is, for example, not less than 0.01 times and not more than 0.1 times the thickness t2. The spacing d2 is, for example, not less than 0.01 times and not more than 0.1 times the spacing d1. The second positive terminal plate 31 and the second negative terminal plate 32 are not limited to plate configurations and may have sheet configurations or film configurations. The second positive terminal plate 31 and the second negative terminal plate 32 may be flexible. For example, the second positive terminal plate 31 and the second negative terminal plate 32 may have structures such as flexible printed circuit boards.

The terminal plates 21, 22, 31, and 32 include, for example, copper plates. The terminal plates 21, 22, 31, and 32 may include, for example, other metal materials of aluminum, brass, etc. The materials of the terminal plates 21, 22, 31, and 32 may be any electrically conductive material that can provide the necessary electrical conductivity.

Figure 6A:
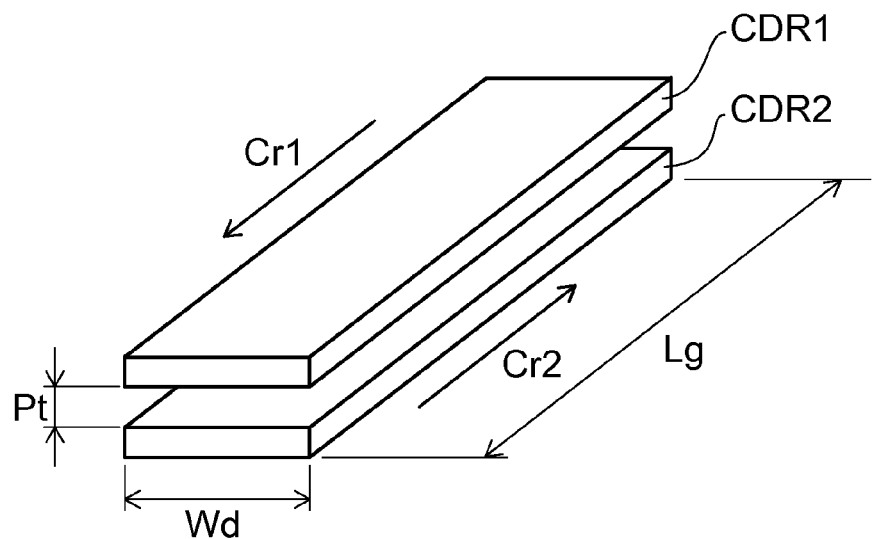
FIG. 6A and FIG. 6B are a schematic view and a graph of an example of a simulation calculating the inductance.
Figure 6B:
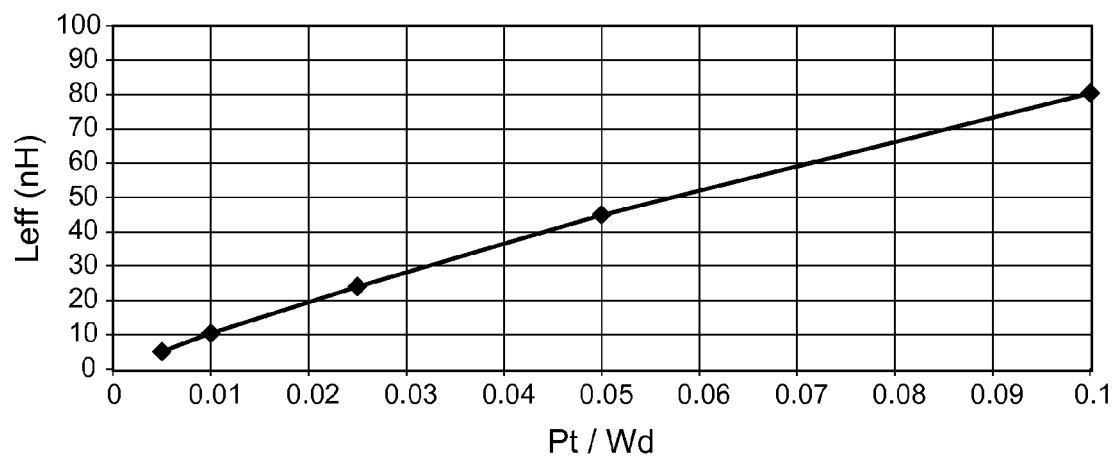

FIG. 6A and FIG. 6B are a schematic view and a graph of an example of a simulation calculating the inductance.

FIG. 6A schematically shows the model used in the simulation.

FIG. 6B schematically shows an example of the calculation results of the inductance of the model shown in FIG. 6A.

As shown in FIG. 6A, the model includes two conductors CDR1 and CDR2 disposed to be parallel to each other. As illustrated by arrows Cr1 and Cr2, the orientations of the currents flowing in the conductors CDR1 and CDR2 are mutually-reverse orientations in the simulation. Thus, in the simulation, the inductance is determined for the parallel plates in which currents of reverse orientations flow.

In the simulation, the configuration of the conductor CDR2 is the same as the configuration of the conductor CDR1. The configurations of the conductors CDR1 and CDR2 are rectangular plate configurations. Here, the width of each of the conductors CDR1 and CDR2 is Wd (mm). The spacing between the conductors CDR1 and CDR2 is Pt (mm). The length of each of the conductors CDR1 and CDR2 is Lg. The length Lg is set to 1 m. The thickness of each of the conductors CDR1 and CDR2 is set to be the same as the spacing Pt.

A self-inductance $L_{self}$ of each of the conductors CDR1 and CDR2 can be determined by Formula (1) recited below.

$$L_{self} = \mu_0(Pt/Wd) \quad (1)$$

In Formula (1), $\mu_0$ is the permeability (H/m) in a vacuum. Generally, $\mu_0$ is $4\pi \times 10^{-7}$ H/m. An effective inductance $L_{eff}$ (nH/m) of one of the conductors CDR1 or CDR2 can be determined from the difference between the self-inductance $L_{self}$ of each of the conductors CDR1 and CDR2 and a mutual inductance M between the conductors CDR1 and CDR2. In other words, $L_{eff} = L_{self} - M$. For the method for calculating the mutual inductance M between the conductors CDR1 and CDR2, it is sufficient to use a well-known calculation method published in the Electrical Engineering Handbook, etc. In the simulation, the effective inductance $L_{eff}$ is calculated for multiple proportions Pt/Wd by changing the proportion Pt/Wd of the spacing Pt and the width Wd.

FIG. 6B is a graph of an example of the calculation results of the effective inductance $L_{eff}$.

In FIG. 6B, the horizontal axis is the proportion Pt/Wd; and the vertical axis is the effective inductance $L_{eff}$.

For the parallel plates in which the currents having reverse orientations flow as shown in FIG. 6B, the effective inductance $L_{eff}$ has a substantially proportional relationship with the proportion Pt/Wd. The effective inductance $L_{eff}$ can be reduced by, for example, making the spacing Pt narrow.

Thus, the effective inductance of the conductors can be reduced by stacking the conductors in which the currents flow with mutually-reverse orientations and reducing the gap between the conductors. In the semiconductor device 10 according to the embodiment, the spacing d2 between the main body unit 31a of the second positive terminal plate 31 and the main body unit 32a of the second negative terminal plate 32 is shorter than the spacing d1 between the main body unit 21a of the first positive terminal plate 21 and the main body unit 22a of the first negative terminal plate 22. In other words, in the semiconductor device 10, the inductance of the interconnect path due to the second positive terminal plate 31 and the second negative terminal plate 32 is smaller than the inductance of the interconnect path due to the first positive terminal plate 21 and the first negative terminal plate 22.

The current that has a large current change rate when switching flows mainly through the interconnect path of the second positive terminal plate 31 and the second negative terminal plate 32. The current that has the large current change rate when switching is a high frequency current and has a small permeation depth (skin depth) that is affected by the frequency. For example, the permeation depth is 0.066 mm when a high frequency current having a frequency 1 MHz is conducted in a copper plate. In other words, there is not a large difference in the alternating current resistance value between a conductor having a thickness 1.5 mm and a conductor having a thickness 0.1 mm. There is not a large difference between the conduction characteristics for a thickness of 1.5 mm and a thickness of 0.1 mm.

On the other hand, because the resistance of the conductor when conducting (when ON) is a direct current resistance, the conductor cross-sectional area is small and the resistance becomes large in the case where the conductor is thin. However, in the embodiment, the first positive terminal plate 21 and the first negative terminal plate 22 have thicknesses of, for example, 1.5 mm. In other words, the current flows mainly in the interconnect path of the first positive terminal plate 21 and the first negative terminal plate 22 when conducting. Because a parallel circuit is used, the current load is determined by the reciprocal of the resistance.

According to the embodiment, when the semiconductor device 10 is conducting (ON), the conduction loss and temperature increase of the conductors can be suppressed because the current flows mainly in the first positive terminal plate 21 and the first negative terminal plate 22 which are thick. Then, when switching, the current flows mainly in the second positive terminal plate 31 and the second negative terminal plate 32 which are thin. For example, the surge voltage can be suppressed by the reduction of the inductance.

The thickness of the stacked portion of the second positive terminal plate 31 and the second negative terminal plate 32 is about 0.3 mm even when including the insulating member 35. Therefore, it is possible for the entire stacked body to have bendability. In other words, the stress can be relaxed even without providing the bend portions 21d and 22d such as those of the first positive terminal plate 21 and the first negative terminal plate 22. Therefore, the inductance reduction effect can be increased by insulatively stacking a wider surface area.

The inductance reduction effect was confirmed using numerical analysis. In the case of a reference example in which the second positive terminal plate 31 and the second negative terminal plate 32 are not provided and only the first positive terminal plate 21 and the first negative terminal plate 22 are provided, the inductance of the ⅓ model TM is about 30 nH. In the case where three ⅓ models TM are connected in parallel, the inductance is about 10 nH.

On the other hand, in the semiconductor device 10 according to the embodiment, the inductance of the ⅓ model TM is about 20 nH. Compared to the reference example, the inductance is about ⅔ (reduced by about 30%); and it can be said that the reduction effect of the inductance is obtained. The inductance analysis value is the inductance of the entire device including the inductance of not only the terminal plate units but also the aluminum wires and the copper foil patterns of the insulating substrate.

Considering the inductance analysis value, it can be said that the inductance reduction effect of the terminal plate portion according to the embodiment is large.

Generally, inverter devices of various applications are expected to be smaller while having high efficiency and high reliability. To realize such a size reduction, it is necessary to improve the semiconductor device (the power semiconductor module) which is the key component of the inverter device.

To increase the efficiency of the inverter device, it is important to reduce the amount of heat generated when the current is applied to the power semiconductor module, i.e., to reduce losses. However, to suppress the temperature increase due to the electrical heat generation, it is necessary to provide a cooling mechanism; and because the cooling mechanism normally requires a large volume, the cooling mechanism becomes the primary factor that dominates the size of the inverter device. Therefore, reducing the losses of the inverter device makes the size reduction possible.

Also, switching is expected to be performed at higher switching frequencies. If the switching frequency can be increased, the components such as the capacitors, the reactors, etc., included in the major circuit of the inverter device can be downsized; and the device can be downsized by downsizing these components that occupy a large volumetric ratio inside the device.

A power semiconductor element such as a switching element, etc., is contained in the power semiconductor module; and it is important to utilize the power semiconductor element efficiently. In other words, it is desirable to perform conduction at values as close as possible to the permissible upper limits of the rated conduction such as the voltage, the current, etc., of the power semiconductor element. Even in the case where the power semiconductor element is used at conduction conditions close to the permissible upper limits, the reliability is expected to be maintained long-term.

To downsize the inverter device, the current-carrying capacity of the power semiconductor module is expected to be increased and the switching is expected to be performed at even higher speeds (higher frequencies); and actual performance improvements directed toward such improvements are progressing. Simultaneously, as described above, it is necessary to reduce the amount of heat generated and maintain the reliability long-term for the power semiconductor module.

The power semiconductor chip is contained in the package interior of the power semiconductor module; and the power semiconductor chip is a key device of the power semiconductor module. The power semiconductor chip is a component manufactured by performing fine patterning of a wafer of silicon, etc.; and due to the progress of semiconductor technology, the current-carrying capacity per chip has continued to increase.

However, chips must be multiply combined to configure a large-capacity inverter device. It is necessary to connect the chips multiply in parallel to provide the current capacity necessary for the device.

Many chips are contained in one package and are electrically connected in parallel in the package interior by various interconnect members inside the package. Thereby, a method for configuring a package having a large current-carrying capacity is favorable; and various technology developments relating to the package configuration are progressing.

The increased capacity of the module has the advantage relating to the conduction characteristics in that the current load between the parallel chips is easily set to be uniform. Also, by reducing the occupied space of the package portion, the device can be downsized; there are advantages also from the device perspective such as reducing the number of components used; and it is advantageous from the perspective of cost reduction as well.

On the other hand, various technical challenges relating to the configuration accompany the increased capacity of the module. One relates to the internal interconnect members of the package. In the case where the module is applied to the inverter device, the major circuit interconnect of the package interior functions as a portion of a major circuit of the inverter. Therefore, the internal interconnect members of the package are expected to have small parasitic impedances.

The resistance component of the impedance is one factor of heat generation when applying a current to the major circuit of the device. The magnitude of the heat generation of the internal interconnects of the package affects the efficiency of the device. Also, because the temperature increase when applying a current to the power module is affected, there are cases where the reliability of the power module also is affected. It is desirable for the resistance component of the internal interconnects to be small because it is desirable for both the amount of heat generated and the temperature increase to be smaller.

The inductance component of the configuration affects the surge voltage when switching. The surge voltage when switching is proportional to the inductance of the module internal interconnects. In the case where the surge voltage generated is large when applying a current, a voltage that exceeds the permissible voltage is applied to the power semiconductor chip; and there is a possibility that failure and/or a shorter life may occur.

Therefore, a method for suppressing the current change rate is used to suppress the switching surge voltage. As described above, because of the direction toward operating at higher switching frequencies, from this perspective, the suppression of the current change rate is undesirable; and the suppression of the current change rate also is unfavorable because the suppression of the current change rate is accompanied by the disadvantage of a switching loss increase. Therefore, the inductance component is expected to be suppressed.

Although the interconnect members of the package are expected to have lower impedance, the lower impedance cannot always be achieved sufficiently due to the various necessary conditions of the package configuration. Specifically, the following reasons exist.

As described above, the power module includes power semiconductor chips that are multiply connected in parallel. The number of chips contained may be as many as several tens of chips. A well-known structure is often used in which all of the chips are disposed on the same surface in the package interior, and the heat generation of the chips is efficiently dissipated from the power module heat dissipation surface via the insulating substrate having good thermal conductivity and the base plate having good thermal conductivity.

By disposing the chips in a plane, the interconnect length of the interconnect members connecting the chips in parallel becomes long; and the impedance (the resistance and the inductance) easily becomes intrinsically large.

Further, it is necessary to employ interconnect materials, interconnect configurations, and construction methods that conform to the interconnect section of the package interior. For example, pure aluminum wires having a small wire diameter are used as the interconnects connected to the chip front surface electrodes; and the pure aluminum wires are laid out using ultrasonic connections. On the other hand, the interconnects connected to the chip back surface electrodes include the thin copper foil pattern formed at the insulating substrate front surface. Solder bonding is often used for the bonds. Due to the relationship of configuring a portion of the interconnect path using the thin copper foil pattern and the aluminum wires having the small wire diameter, the cross-sectional area of the interconnect members cannot be increased; and in particular, the reduction of the resistance component is difficult.

For the aluminum wires on the chip front surface side, one end also is connected to another interconnect circuit pattern at the insulating substrate front surface. Parallel electrical connection of multiple chips is performed on the interconnect pattern of the substrate surface. Limitlessly increasing the size of the insulating substrate is not expedient from the perspective of ensuring the reliability of the insulating substrate itself, ensuring the reliability of the bonding portions between the insulating substrate and the base plate, the degree of difficulty of the intermediate inspection in the power module assembly processes, etc. Therefore, a limit of the size of the insulating substrate is set; multiple substrates are used when the number of chips used exceeds the limit of the number of chips mounted on the substrate; and the multiple substrates are used by performing a parallel electrical connection between the substrates.

The parallel electrical connection member between the substrates includes an electrode plate made of a patterned copper plate. A portion of the electrode plate is elongated; and the elongated end portion is caused to protrude at the package front surface and is used as a module terminal. In particular, because all of the module current which is the combined conduction current of all of the chips is conducted through the module terminal unit, it is necessary to ensure a current-carrying capacity that matches the conduction. In other words, the current-carrying capacity is ensured by increasing the conductor cross-sectional area. In such a case, the enlargement of the conductor width also is limited; and there are many cases where it is necessary to ensure the cross-sectional area by increasing the conductor thickness as well.

From the perspective of the inductance reduction as well, the configuration and layout of the terminal plates are important. For the inductance reduction, the effect of the interconnect length reduction is larger than the effect of the cross-sectional area increase. On this point, the inductance reduction is in principle different from the resistance. The interconnect length of the terminal plate from the insulating substrate to the module terminal is much longer than the aluminum interconnect of the chip front surface and the copper pattern of the substrate surface; and the inductance of the terminal plate generally is large because all of the current concentrates. Among the power module internal interconnects, the proportion of the inductance of the terminal plate is large.

That is, for the inductance reduction of the power module internal interconnects, it is indispensable to realize the inductance reduction of the terminal plate. Under the constraint conditions at various locations of the configuration, a method for insulatively stacking the positive terminal plate and the negative terminal plate is used as a method for reducing the inductance. By insulatively stacking conductors having band configurations so that currents having reverse orientations flow when applying the currents, the generated flux can be canceled; a negative mutual inductance is generated; and therefore, the effective inductance which is the total of these inductances can be reduced.

The insulatively stacked structure of the positive and negative terminal plates cannot always provide sufficient effects when employed partially. If the width of the positive and negative terminal plates is set to a common width and the insulatively stacked distance, i.e., the gap between the two conductors, can be limitlessly reduced, the effective inductance also can be limitlessly reduced. However, it is difficult to sufficiently set the widths of the positive and negative terminals perfectly to a common width and limitlessly reduce the gap between the conductors.

The positions of the substrate side connection point of the positive and negative terminal plates and the terminal unit of the module front surface are distal; and the reduction effect due to the mutual inductance cannot be expected very much for the portions along the way to the insulatively stacked unit of the two conductors.

Although a form is desirable in which both the positive and negative terminal plates, the substrate connector, and the module terminal unit can be connected using the shortest distance, other considerations are necessary at the vicinity of the substrate connector. At the substrate connector, one end of the positive and negative terminal plates is connected to the copper foil pattern of the insulating substrate front surface by solder bonding. The package size enlargement must be avoided by setting the solder bonding to have the minimum necessary surface area.

It is also difficult to ensure the long-term bonding reliability due to the temperature change during use. Therefore, a method for reducing the produced stress is used in which the elastic deformation amount is increased by adding a bend configuration having a U-shaped configuration to the positive and negative terminal plates directly proximal to the substrate bonding portion. The addition of the U-shaped bend configuration may cause an increase of the interconnect path length and therefore may cause the inductance to increase.

There are limits on reducing the inter-conductor distance of the insulatively stacked unit due to configuration constraints. Because the elastic deformation of the U-shaped bend recited above also affects the conductor in the stacking direction, it is necessary to ensure the insulating distance considering the deformation amount. Considerations are made by using a flexible material such as a silicone gel as the insulating material of the U-shaped bend portion so as not to obstruct the flexibility of the bend portion. Therefore, in the case where the insulating distance is set to be too small, there is a risk of mutual contact due to deformation. It is also necessary to consider the deformation due to mechanical vibrations during use and the manufacturing fluctuation of the terminal placement positions in the module assembly.

Thus, sufficient effects have not been realized for the inductance reduction by the insulated stacking of the positive and negative terminal plates.

Conversely, in the semiconductor device 10 according to the embodiment, the second positive terminal plate 31 and the second negative terminal plate 32 are connected in parallel to the first positive terminal plate 21 and the first negative terminal plate 22. Thereby, in the semiconductor device 10 as recited above, the inductance parasitically occurring in the internal interconnects can be reduced. Thereby, for example, the surge voltage when switching can be suppressed. For example, switching can be performed at high frequencies.

Second Embodiment

Figure 7A:
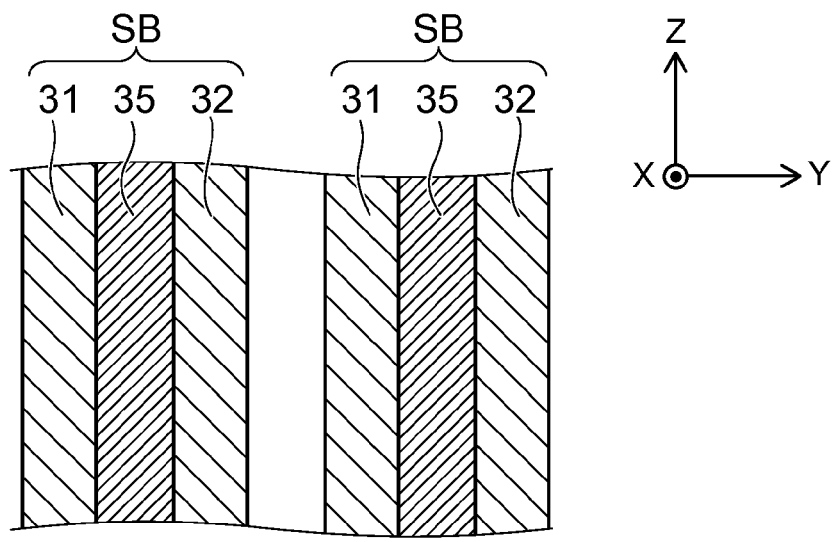
FIG. 7A and FIG. 7B are partial cross-sectional views schematically showing a portion of a semiconductor device according to a second embodiment.
Figure 7B:
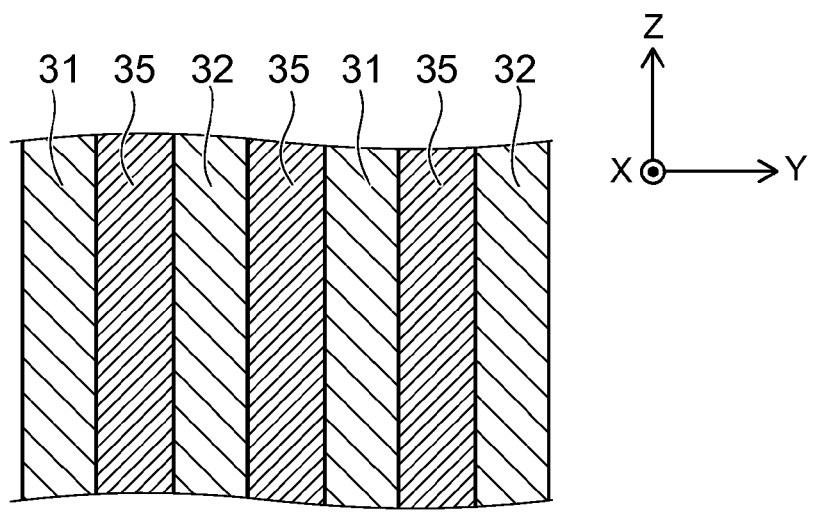

FIG. 7A and FIG. 7B are partial cross-sectional views schematically showing a portion of a semiconductor device according to a second embodiment.

In the example as shown in FIG. 7A, the second positive terminal plate 31 and the second negative terminal plate 32 are multiply provided. In the example, a stacked body SB that includes the second positive terminal plate 31, the second negative terminal plate 32, and the insulating member 35 is multiply provided. The stacked bodies SB are arranged in the Y-axis direction with a spacing between the stacked bodies SB. In the example, two stacked bodies SB are provided. In other words, in the example, three interconnect paths are formed to be connected in parallel. The number of stacked bodies SB is not limited to two and may be three or more. For example, it is favorable for the number of stacked bodies SB to be as large as possible within the permissible mounting space.

Thus, the second positive terminal plate 31 and the second negative terminal plate 32 may be multiply provided.

Thereby, the inductance can be suppressed further. For example, the inductance can be halved. As described above, the thickness of the stacked body SB is about 0.3 mm. Therefore, even in the case where the multiple stacked bodies SB are provided, a large mounting space is unnecessary. For example, the inductance can be suppressed further without causing the enlargement of the semiconductor device 10.

In the example as shown in FIG. 7B, the multiple second positive terminal plates 31 and the multiple second negative terminal plates 32 are stacked alternately in the Y-axis direction with the insulating members 35 interposed. In other words, in the example, the multiple second positive terminal plates 31, the multiple second negative terminal plates 32, and the multiple insulating members 35 are stacked in the order of the second positive terminal plate 31, the insulating member 35, the second negative terminal plate 32, and the insulating member 35; and this stacking is repeated. In the example, the number of multiple second positive terminal plates 31 may be the same as or different from the number of multiple second negative terminal plates 32.

Thus, in the case where the multiple second positive terminal plates 31 and the multiple second negative terminal plates 32 are provided, the terminal plates 31 and 32 may be arranged at a spacing such as in FIG. 7A or may be arranged alternately with the insulating members 35 interposed as in FIG. 7B.

Third Embodiment

Figure 8:
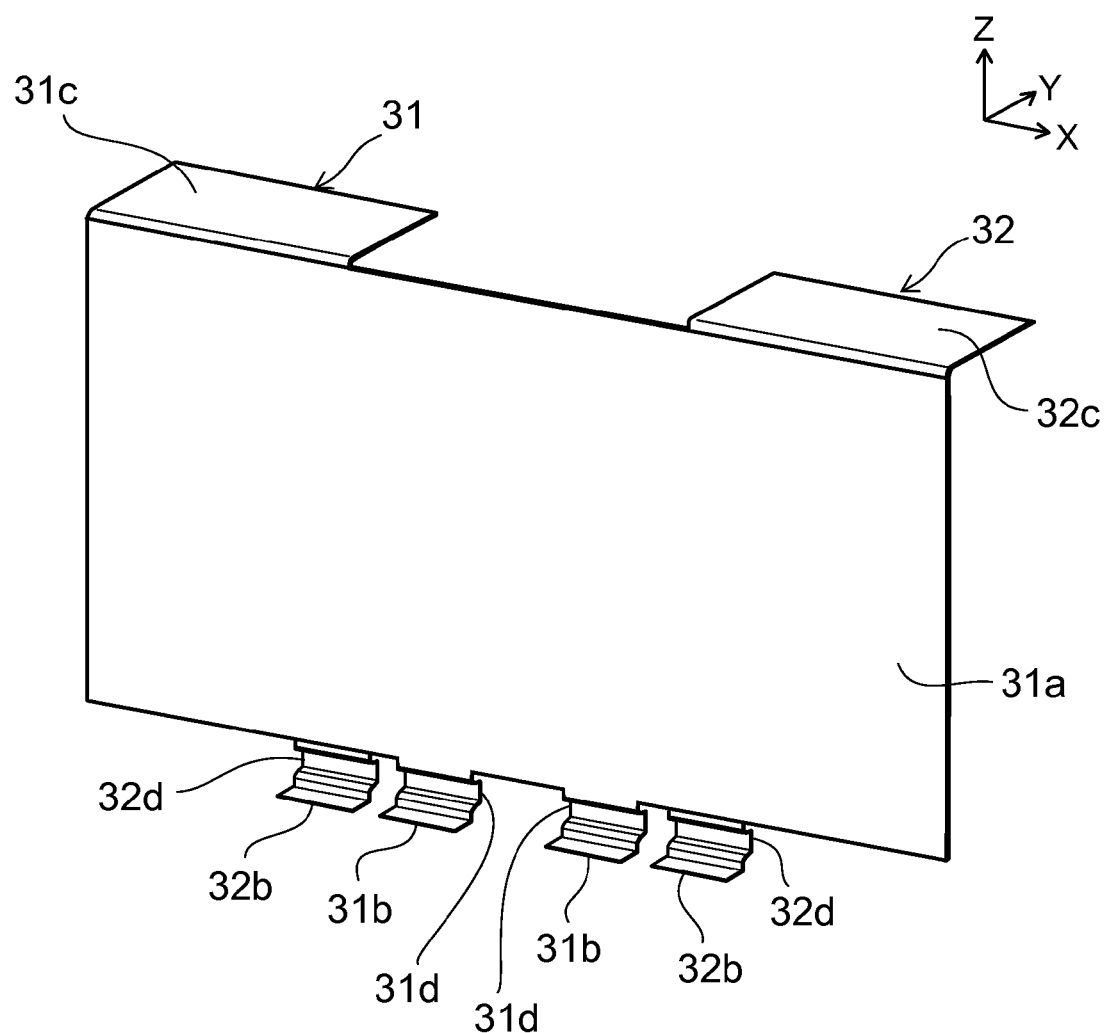
FIG. 8 is a perspective view schematically showing a portion of a semiconductor device according to a third embodiment.

FIG. 8 is a perspective view schematically showing a portion of a semiconductor device according to a third embodiment.

In the example as shown in FIG. 8, the second positive terminal plate 31 includes multiple bend portions 31d. The multiple bend portions 31d are provided between the main body unit 31a and each of the multiple connectors 31b. Each of the bend portions 31d is bent around an axis in the X-axis direction. For example, each of the bend portions 31d reduces the stress applied to each of the connectors 31b by elastic deformation due to the temperature change during use. For example, each of the bend portions 31d improves the bonding reliability of each of the connectors 31b. In the example, each of the bend portions 31d has a bend configuration that is bent into a U-shaped configuration. The configuration of each of the bend portions 31d is not limited thereto and may be any configuration.

Also, in the example, the second negative terminal plate 32 includes multiple bend portions 32d. The multiple bend portions 32d are provided between the main body unit 32a and each of the multiple connectors 32b. The configuration of each of the bend portions 32d is substantially the same as the configuration of each of the bend portions 31d of the second positive terminal plate 31; and a detailed description is therefore omitted.

Because of formability problems due to the plate thicknesses for the first positive terminal plate 21 and the first negative terminal plate 22, the bend portions 21d and 22d are aligned with the surface parallel to the main body units 21a and 22a. In such a case, the bend portions 21d and 22d cause the interconnect path length to increase.

On the other hand, for the second positive terminal plate 31 and the second negative terminal plate 32, a three-dimensional bend configuration is possible because the plate thicknesses are thin and flexible. Thereby, for the second positive terminal plate 31 and the second negative terminal plate 32, an increase of the inductance due to adding bend configurations can be suppressed.

Fourth Embodiment

Figure 9A:
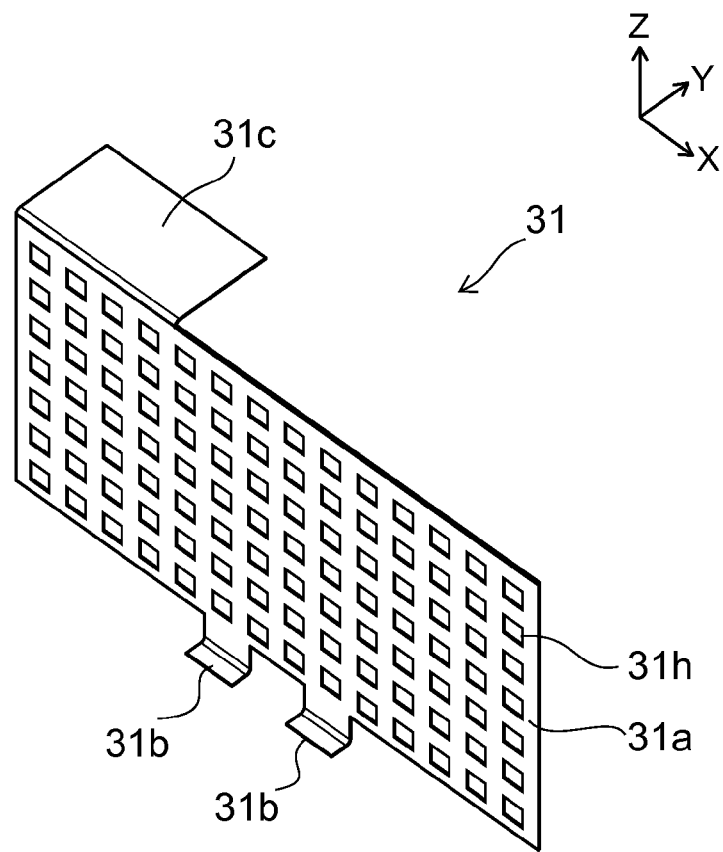
FIG. 9A and FIG. 9B are perspective views schematically showing a portion of a semiconductor device according to a fourth embodiment.
Figure 9B:
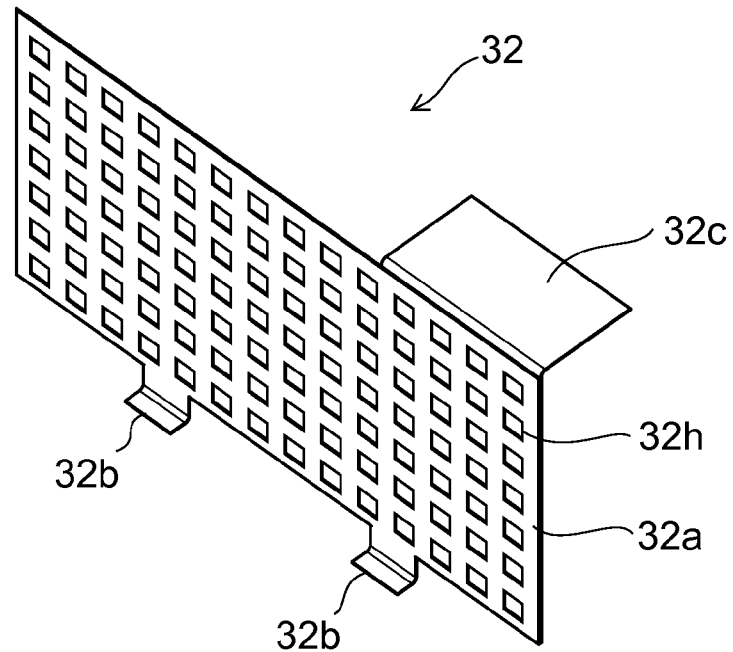

FIG. 9A and FIG. 9B are perspective views schematically showing a portion of a semiconductor device according to a fourth embodiment.

In the example as shown in FIG. 9A and FIG. 9B, multiple openings 31h are provided in the main body unit 31a of the second positive terminal plate 31. Similarly, multiple openings 32h are provided in the main body unit 32a of the second negative terminal plate 32. Openings 31h and 32h have quadrilateral configurations. The configurations of the openings 31h and 32h are not limited to quadrilateral configurations and may be any configuration. The openings 31h and 32h are arranged in two-dimensional matrix configurations in the X-axis direction and the Z-axis direction. The main body units 31a and 32a may have, for example, mesh configurations such as expanded metal.

For example, the main body units 31a and 32a themselves can have bendability in the example. Thereby, for example, the stress applied to each of the connectors 31b can be reduced without providing the bend portions 31d and 32d. For example, the increase of the inductance due to the increase of the interconnect path length can be suppressed further. The bendability may be increased further by providing the openings 31h and 32h in the main body units 31a and 31b in the state in which the bend portions 31d and 32d are provided.

Fifth Embodiment

Figure 10A:
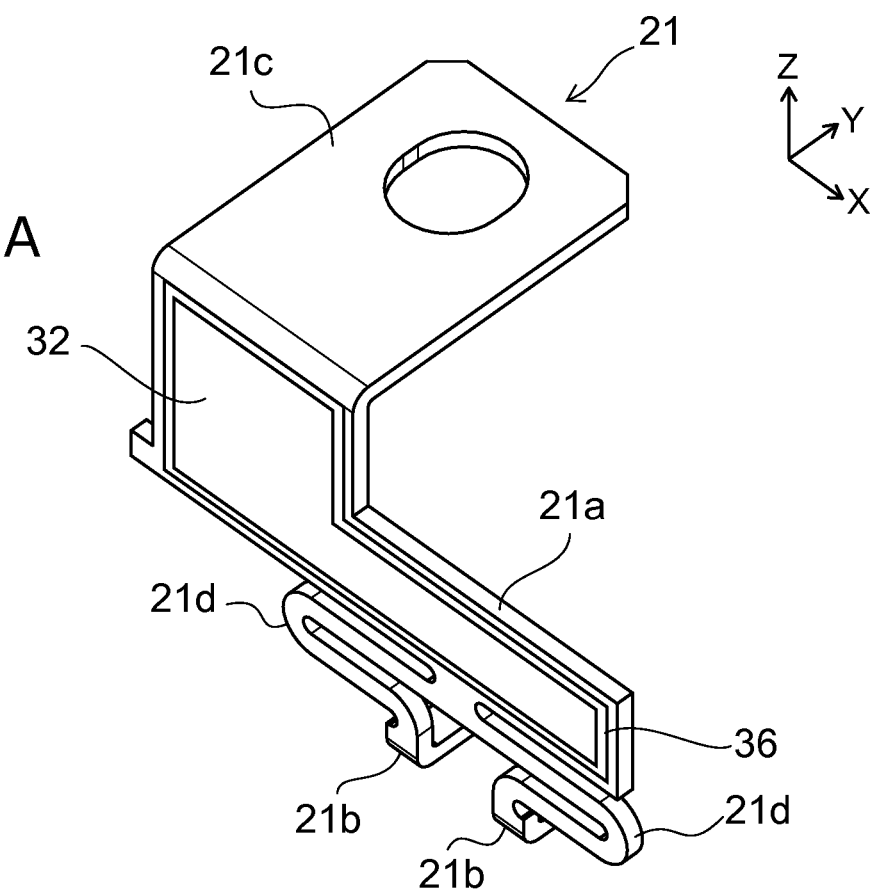
FIG. 10A and FIG. 10B are perspective views schematically showing a portion of a semiconductor device according to a fifth embodiment.
Figure 10B:
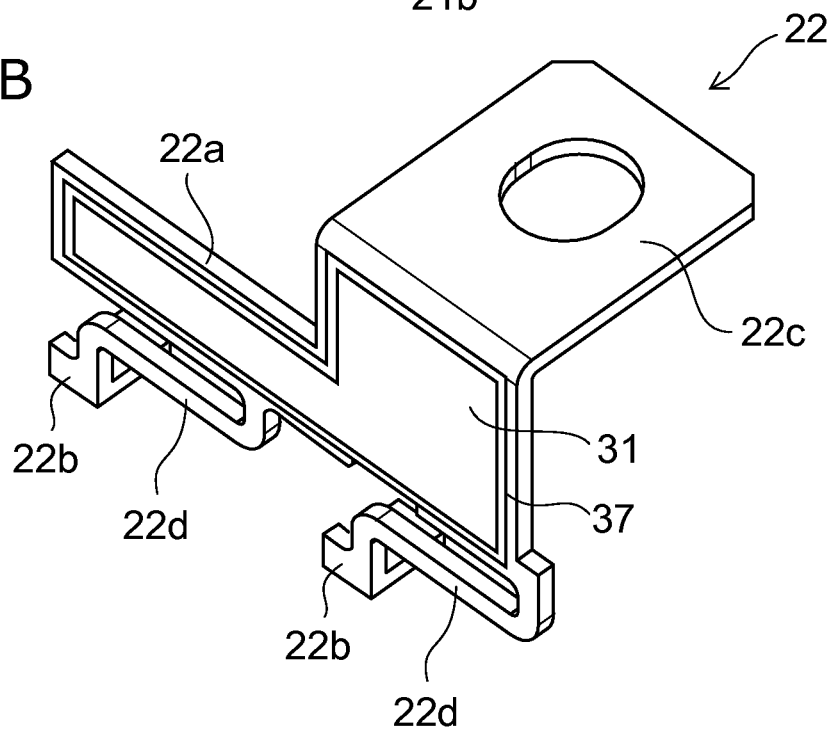

FIG. 10A and FIG. 10B are perspective views schematically showing a portion of a semiconductor device according to a fifth embodiment.

In the example as shown in FIG. 10A, the second negative terminal plate 32 is provided to overlap the main body unit 21a of the first positive terminal plate 21 with an insulating member 36 interposed. In other words, the second negative terminal plate 32 is adhered to the main body unit 21a with the insulating member 36 interposed. The second negative terminal plate 32 is electrically connected to the first negative terminal plate 22 and electrically connected to each of the second interconnect patterns 13c of each of the substrates 13 by not-shown interconnects, etc.

In the example as shown in FIG. 10B, the second positive terminal plate 31 is provided to overlap the main body unit 22a of the first negative terminal plate 22 with an insulating member 37 interposed. The second positive terminal plate 31 is electrically connected to the first positive terminal plate 21 and electrically connected to each of the first interconnect patterns 13b of each of the substrates 13 by not-shown interconnects, etc.

The thickness of the second positive terminal plate 31 is thinner than the thickness of the main body unit 21a. The thickness of the second negative terminal plate 32 is thinner than the thickness of the main body unit 22a. The spacing between the main body unit 21a and the second negative terminal plate 32 is narrower than the spacing d1 between the main body unit 21a and the main body unit 22a. The spacing between the main body unit 22a and the second positive terminal plate 31 is narrower than the spacing d1 between the main body unit 21a and the main body unit 22a. In other words, the spacing between the main body unit 21a and the second negative terminal plate 32 is the thickness of the insulating member 36. In other words, the spacing between the main body unit 22a and the second positive terminal plate 31 is the thickness of the insulating member 37. As described above, the spacing d1 is, for example, 2.3 mm. The spacing between the main body unit 21a and the second negative terminal plate 32 and the spacing between the main body unit 22a and the second positive terminal plate 31 are, for example, 0.1 mm.

Thus, in the example, the second positive terminal plate 31 is insulatively stacked with the first negative terminal plate 22; and the second negative terminal plate 32 is insulatively stacked with the first positive terminal plate 21. Even in such a case, similarly to the embodiments recited above, the inductance that parasitically occurs in the internal interconnects can be reduced. For example, the surge voltage when switching can be suppressed. For example, switching can be performed at high frequencies.

According to the embodiments, a semiconductor device is provided in which the inductance parasitically occurring in the internal interconnects is suppressed.

Hereinabove, embodiments of the invention are described with reference to specific examples. However, the embodiments of the invention are not limited to these specific examples. For example, one skilled in the art may similarly practice the invention by appropriately selecting specific configurations of components included in the semiconductor device such as the base plate, the substrate, the semiconductor chip, the case, the first terminal plate, the second terminal plate, the third terminal plate, the fourth terminal plate, the insulating member, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    a base plate having a support surface;
    a semiconductor chip provided on the support surface, the semiconductor chip including a switching element, the switching element including a first electrode, a second electrode, and a control electrode;
    a first terminal plate including a first main body unit, the first terminal plate being electrically connected to the first electrode;
    a second terminal plate including a second main body unit, the second main body unit opposing the first main body unit at a first spacing from the first main body unit, the second terminal plate being electrically connected to the second electrode;
    a third terminal plate including a third main body unit, the third main body unit opposing the first main body unit and the second main body unit at prescribed spacings from the first main body unit and the second main body unit, the third terminal plate being electrically connected to the first electrode and the first terminal plate; and
    a fourth terminal plate including a fourth main body unit, the fourth main body unit opposing the third main body unit at a second spacing from the third main body unit, the fourth terminal plate being electrically connected to the second electrode and the second terminal plate,
    the second spacing being narrower than the first spacing.

2. The device according to claim 1, further comprising a case provided on the support surface, the case being insulative, the case covering the semiconductor chip, the first main body unit, the second main body unit, the third main body unit, and the fourth main body unit,
    the first main body unit, the second main body unit, the third main body unit, and the fourth main body unit extending in a perpendicular direction perpendicular to the support surface,
    a first terminal plate including a first terminal unit, the first terminal unit being provided at one end in the perpendicular direction of the first main body unit to protrude outside the case, and
    a second terminal plate including a second terminal unit, the second terminal unit being provided at one end in the perpendicular direction of the second main body unit to protrude outside the case.

3. The device according to claim 1, further comprising a substrate provided on the support surface,
    the substrate including a substrate main body, a first interconnect pattern, and a second interconnect pattern, the substrate main body being insulative, the first interconnect pattern being provided on the substrate main body, the second interconnect pattern being provided to be separated from the first interconnect pattern on the substrate main body,
    the semiconductor chip being provided on the first interconnect pattern of the substrate,
    the first electrode being electrically connected to the first interconnect pattern,
    the second electrode being electrically connected to the second interconnect pattern,
    the first terminal plate and the third terminal plate being electrically connected to the first electrode via the first interconnect pattern,
    the second terminal plate and the fourth terminal plate being electrically connected to the second electrode via the second interconnect pattern.

4. The device according to claim 3, wherein
    a plurality of the substrates and a plurality of the semiconductor chips are provided,
    the substrates are provided to be arranged in a first direction on the support surface,
    each of the semiconductor chips is provided on each of the first interconnect patterns of each of the substrates,
    the first electrodes of the semiconductor chips are electrically connected to the first interconnect patterns, the second electrodes of the semiconductor chips are electrically connected to the second interconnect patterns, the first main body unit, the second main body unit, the third main body unit, and the fourth main body unit extend in the first direction, the first terminal plate and the third terminal plate are electrically connected to each of the first interconnect patterns, and the second terminal plate and the fourth terminal plate are electrically connected to each of the second interconnect patterns.

5. The device according to claim 1, further comprising an insulating member provided between the third main body unit and the fourth main body unit, a plurality of the third terminal plates, a plurality of the fourth terminal plates, and a plurality of the insulating members being provided, and stacked bodies being arranged with a spacing between the stacked bodies, each of the stacked bodies including the third terminal plate, the fourth terminal plate, and the insulating member.

6. The device according to claim 1, further comprising an insulating member provided between the third main body unit and the fourth main body unit, a plurality of the third terminal plates, a plurality of the fourth terminal plates, and a plurality of the insulating members being provided, and the third terminal plates and the fourth terminal plates being stacked alternately with the insulating members interposed.

7. The device according to claim 1, wherein the first terminal plate includes a first connector electrically connected to the first electrode, the second terminal plate includes a second connector electrically connected to the second electrode, the third terminal plate includes a third connector and a bend portion, the third connector is electrically connected to the first electrode, the bend portion of the third terminal plate is provided between the third main body unit and the third connector, and the fourth terminal plate includes a fourth connector and a bend portion, the fourth connector is electrically connected to the second electrode, the bend portion of the fourth terminal plate is provided between the fourth main body unit and the fourth connector.

8. The device according to claim 7, wherein the third main body unit and the fourth main body unit extend in one direction parallel to the support surface, and the bend portion of the third terminal plate and the bend portion of the fourth terminal plate are bent around an axis in the one direction.

9. The device according to claim 1, wherein the first terminal plate includes a first connector and a bend portion, the first connector is electrically connected to the first electrode, the bend portion of the first terminal plate is provided between the first main body unit and the first connector, and the second terminal plate includes a second connector and a bend portion, the second connector is electrically connected to the second electrode, a bend portion of the second terminal plate is provided between the second main body unit and the second connector.

10. The device according to claim 9, wherein the first main body unit and the second main body unit extend in one direction parallel to the support surface, and the bend portion of the first terminal plate and the bend portion of the second terminal plate are bent around an axis in one other direction parallel to the support surface and perpendicular to the one direction.

11. The device according to claim 1, wherein the third main body unit has a plurality of openings, and the fourth main body unit has a plurality of openings.

12. The device according to claim 11, wherein the openings are arranged in two-dimensional matrix configurations, and the third main body unit and the fourth main body unit have mesh configurations.

13. The device according to claim 1, wherein the thickness of the third main body unit is not less than 0.01 times and not more than 0.1 times the thickness of the first main body unit, and the thickness of the fourth main body unit is not less than 0.01 times and not more than 0.1 times the thickness of the second main body unit.

14. The device according to claim 1, wherein the second spacing is not less than 0.01 times and not more than 0.1 times the first spacing.

15. The device according to claim 1, wherein the third terminal plate and the fourth terminal plate are flexible.

16. The device according to claim 1, further comprising an insulating member provided between the first main body unit and the second main body unit.

17. The device according to claim 1, wherein a plurality of units is provided to be arranged on the support surface, each of the units including the semiconductor chip and the first to fourth terminal plates.

18. A semiconductor device, comprising:

a base plate having a support surface;

a semiconductor chip provided on the support surface, the semiconductor chip including a switching element, the switching element including a first electrode, a second electrode, and a control electrode;

a first terminal plate including a first main body unit, the first terminal plate being electrically connected to the first electrode;

a second terminal plate including a second main body unit, the second main body unit being parallel to the first main body unit at a first spacing from the first main body unit, the second terminal plate being electrically connected to the second electrode;

a third terminal plate provided to overlap the second main body unit with an insulating member interposed, the third terminal plate being electrically connected to the first electrode and the first terminal plate; and a fourth terminal plate provided to overlap the first main body unit with an insulating member interposed, the fourth terminal plate being electrically connected to the second electrode and the second terminal plate, a second spacing between the first main body unit and the fourth terminal plate is narrower than the first spacing, and a third spacing between the second main body unit and the third terminal plate is narrower than the first spacing.

19. The device according to claim 1, wherein a thickness of the third main body unit is thinner than a thickness of the first main body unit, and a thickness of the fourth main body unit is thinner than a thickness of the second main body unit.

20. The device according to claim 18, wherein
a thickness of the third terminal plate is thinner than a thickness of the first main body unit, and
a thickness of the fourth terminal plate is thinner than a thickness of the second main body unit.

* * * * *